United States Patent
Thoumazet et al.

(10) Patent No.: US 9,246,131 B2
(45) Date of Patent: *Jan. 26, 2016

(54) LAYERED ELEMENT FOR ENCAPSULATING A SENSTIVE ELEMENT

(75) Inventors: Claire Thoumazet, Paris (FR); Fabrice Abbott, Vienne (FR); Fabienne P. Piroux, Compiegne (FR)

(73) Assignee: SAINT-GOBAIN PERFORMANCE PLASTICS CORPORATION, Aurora, OH (US)

( * ) Notice: Subject to any disclaimer, the term of this patent is extended or adjusted under 35 U.S.C. 154(b) by 880 days.

This patent is subject to a terminal disclaimer.

(21) Appl. No.: 13/395,412

(22) PCT Filed: Sep. 3, 2010

(86) PCT No.: PCT/EP2010/062999
§ 371 (c)(1),
(2), (4) Date: May 29, 2012

(87) PCT Pub. No.: WO2011/029787
PCT Pub. Date: Mar. 17, 2011

(65) Prior Publication Data
US 2012/0228668 A1  Sep. 13, 2012

Related U.S. Application Data

(60) Provisional application No. 61/254,936, filed on Oct. 26, 2009.

(30) Foreign Application Priority Data

Sep. 10, 2009  (FR) ...................... 09 56207

(51) Int. Cl.
*H01L 51/52* (2006.01)
*C23C 16/02* (2006.01)
(Continued)

(52) U.S. Cl.
CPC ........ *H01L 51/5256* (2013.01); *C23C 16/0245* (2013.01); *C23C 16/345* (2013.01);
(Continued)

(58) Field of Classification Search
CPC .............. H01L 31/048; H01L 31/0327; H01L 51/5256; H01L 51/5237; H01L 51/526; G02B 1/105; G02B 1/115; Y02E 10/50; C03G 5/08214; C03G 5/08221
See application file for complete search history.

(56) References Cited

U.S. PATENT DOCUMENTS 5,172,269 A    12/1992  Ogura et al.
5,234,748 A    8/1993   Demiryont et al.
(Continued)

FOREIGN PATENT DOCUMENTS

CN    102714279 A    10/2012
CN    102714280 A    10/2012
(Continued)

OTHER PUBLICATIONS

The International Search Report for International Application No. PCT/US2012/032616 received from the International Searching Authority (ISA/KR), dated Nov. 30, 2012, 1 page.
(Continued)

*Primary Examiner* — Jose R Diaz
(74) *Attorney, Agent, or Firm* — Abel Law Group, LLP; Chi Suk Kim

(57) ABSTRACT

This layered element (11) for encapsulating an element (12) that is sensitive to air and/or moisture, especially an element that collects or emits radiation such as a photovoltaic cell or an organic light-emitting diode, comprises a polymer layer (1) and a barrier layer (2) against at least one face (1A) of the polymer layer. The barrier layer (2) has a moisture vapor transfer rate of less than $10^{-2}$ g/m² per day and consists of a multilayer of at least two thin hydrogenated silicon nitride layers (21, 22, 23, 24) having alternately lower and higher densities.

14 Claims, 3 Drawing Sheets

(51) Int. Cl.
*C23C 16/34* (2006.01)
*G02B 1/10* (2015.01)
*G02B 1/115* (2015.01)
*H01L 31/048* (2014.01)

(52) U.S. Cl.
CPC .............. *G02B 1/105* (2013.01); *G02B 1/115* (2013.01); *H01L 31/048* (2013.01); *H01L 51/5281* (2013.01); *Y02E 10/50* (2013.01)

(56) References Cited

U.S. PATENT DOCUMENTS

| | | | |
|---|---|---|---|
| 5,254,904 A | 10/1993 | Van De Leest et al. | |
| 5,853,478 A | 12/1998 | Yonehara et al. | |
| 6,068,914 A | 5/2000 | Boire et al. | |
| 6,268,695 B1 | 7/2001 | Affinito | |
| 6,284,382 B1 | 9/2001 | Ishikawa et al. | |
| 6,574,039 B1 | 6/2003 | Murata et al. | |
| 6,589,658 B1 | 7/2003 | Stachowiak | |
| 6,842,288 B1 | 1/2005 | Liu et al. | |
| 6,896,979 B2 | 5/2005 | Sawai et al. | |
| 7,405,005 B2 | 7/2008 | Watanabe | |
| 7,504,332 B2 | 3/2009 | Won et al. | |
| 7,880,966 B2 | 2/2011 | Suzuki | |
| 8,133,577 B2 | 3/2012 | Kuramachi et al. | |
| 8,586,189 B2 | 11/2013 | Ito et al. | |
| 8,766,280 B2 * | 7/2014 | Thoumazet et al. ............ | 257/79 |
| 2002/0090521 A1 | 7/2002 | Nakajima et al. | |
| 2003/0067266 A1 | 4/2003 | Kim et al. | |
| 2003/0104753 A1 | 6/2003 | Graff et al. | |
| 2003/0186064 A1 | 10/2003 | Murata et al. | |
| 2004/0018362 A1 | 1/2004 | Nakajima et al. | |
| 2004/0076835 A1* | 4/2004 | Watanabe ..................... | 428/432 |
| 2004/0160178 A1 | 8/2004 | Qiu et al. | |
| 2004/0229394 A1 | 11/2004 | Yamada et al. | |
| 2005/0012248 A1 | 1/2005 | Yi et al. | |
| 2005/0207016 A1 | 9/2005 | Ando | |
| 2007/0116966 A1 | 5/2007 | Mellott et al. | |
| 2007/0155137 A1 | 7/2007 | Joshi et al. | |
| 2007/0212498 A1 | 9/2007 | Fukushige et al. | |
| 2008/0026198 A1 | 1/2008 | Komada et al. | |
| 2008/0049431 A1 | 2/2008 | Boek et al. | |
| 2008/0138539 A1 | 6/2008 | Breitung et al. | |
| 2008/0213513 A1 | 9/2008 | Kameshima et al. | |
| 2008/0265245 A1 | 10/2008 | Gotoh et al. | |
| 2008/0284331 A1 | 11/2008 | Hayashi | |
| 2009/0072230 A1 | 3/2009 | Ito et al. | |
| 2009/0084963 A1 | 4/2009 | Kost | |
| 2009/0087668 A1 | 4/2009 | Noro et al. | |
| 2009/0095346 A1 | 4/2009 | Hurley et al. | |
| 2009/0096106 A1 | 4/2009 | Vrtis et al. | |
| 2009/0110896 A1 | 4/2009 | Kuramachi et al. | |
| 2009/0128916 A1 | 5/2009 | Noro | |
| 2009/0199901 A1 | 8/2009 | Trassl et al. | |
| 2009/0258237 A1 | 10/2009 | Choi et al. | |
| 2009/0305062 A1 | 12/2009 | Choi et al. | |
| 2010/0089636 A1 | 4/2010 | Ramadas et al. | |
| 2010/0208349 A1 | 8/2010 | Beer et al. | |
| 2010/0215929 A1 | 8/2010 | Seo et al. | |
| 2010/0245991 A1 | 9/2010 | Ishihara et al. | |
| 2010/0330748 A1 | 12/2010 | Chu et al. | |
| 2011/0085233 A1 | 4/2011 | Furusato | |
| 2012/0107387 A1 | 5/2012 | Ochiai et al. | |
| 2012/0228641 A1 | 9/2012 | Thoumazet et al. | |
| 2012/0258294 A1 | 10/2012 | Leyder et al. | |
| 2012/0258295 A1 | 10/2012 | Leyder et al. | |

FOREIGN PATENT DOCUMENTS

| | | |
|---|---|---|
| DE | 10 2008 031405 A1 | 1/2010 |
| EP | 0502790 B1 | 12/1994 |
| EP | 1 329 307 A1 | 7/2003 |
| EP | 1892777 A2 | 2/2008 |
| EP | 2476147 A1 | 7/2012 |
| EP | 2476148 A1 | 7/2012 |
| FR | 2 858 975 A1 | 2/2005 |
| FR | 2 949 775 A1 | 3/2011 |
| FR | 2 949 776 A1 | 3/2011 |
| JP | 2010511267 A | 1/2000 |
| JP | 2000211053 A | 8/2000 |
| JP | 2002260848 A | 9/2002 |
| JP | 2003264062 A | 9/2003 |
| JP | 2003532260 A | 10/2003 |
| JP | 2004022281 A | 1/2004 |
| JP | 2004198590 A | 7/2004 |
| JP | 2004345223 A | 12/2004 |
| JP | 2005510757 A | 4/2005 |
| JP | 2006106239 A | 4/2006 |
| JP | 2006338947 A | 12/2006 |
| JP | 2007017668 A | 1/2007 |
| JP | 2007038529 A | 2/2007 |
| JP | 2007090702 A | 4/2007 |
| JP | 2007098931 A | 4/2007 |
| JP | 2007265841 A | 10/2007 |
| JP | 2007277631 A | 10/2007 |
| JP | 2009073090 A | 4/2009 |
| JP | 2009090634 A | 4/2009 |
| JP | 2009117817 A | 5/2009 |
| JP | 2009133000 A | 6/2009 |
| JP | 2010237415 A | 10/2010 |
| KR | 10-2004-0106431 A | 12/2004 |
| KR | 10-2011-0000818 A | 1/2011 |
| MX | 2012002892 A | 6/2012 |
| WO | 0137006 A1 | 5/2001 |
| WO | 03040782 A1 | 5/2003 |
| WO | 2005045948 A2 | 5/2005 |
| WO | 2005081333 A2 | 9/2005 |
| WO | 2008011919 A1 | 1/2008 |
| WO | 2008054542 A2 | 5/2008 |
| WO | 2009098793 A1 | 8/2009 |
| WO | 2010108894 A1 | 9/2010 |
| WO | 2011004834 A1 | 1/2011 |
| WO | 2011029786 A1 | 3/2011 |
| WO | 2011029787 A1 | 3/2011 |
| WO | 2012139056 A2 | 10/2012 |
| WO | 2012139057 A2 | 10/2012 |

OTHER PUBLICATIONS

The International Search Report for International Application No. PCT/US2012/032618 received from the International Searching Authority (ISA/KR), dated Nov. 28, 2012, 1 page.

Jin-Seong Park et al., "Thin film encapsulation for flexible AM-OLeD: a revew," Semiconductor Science and Technology, vol. 26, No. 3, Mar. 1, 2011, p. 034001, XP55006840.

Zhengxia Chen et al., "Molecular dynamics simulation of water diffusion inside an amorphous polyacrylate latex film," Journal of Polymer Science, Part B: Polymer Phsics, vol. 45, No. 8, Apr. 15, 2007, pp. 884-891, XP55010766.

E. H. H. Jamieson et al., "Structure and oxygen-barrier properties of metallized polymer film," Journal of Materials Science, vol. 18, No. 1, Jan. 1, 1983, pp. 64-80, XP55010762.

Myeon-Cheon Choi et al., "Polymers for flexible displays: From material selection to device applications," Progress in Polymer Science, vol. 33, Feb. 4, 2008, pp. 581-630, XP002609297.

Kuo M. L., et al., "Realization of a near-perfect anitreflection coating for silicon solar energy utilization," Optics Letters, vol. 33, No. 21, Nov. 1, 2008, pp. 2527-2529, XP002578609.

H. Lifka, et al., "50.3: Thin Film Encapuslation of Oled Displays with a NONON Stack," Philips Research Laboratories Eindhoven, Slo 04 DIGEST, pp. 1384-1387, 2004.

International Search Report from Application No. PCT/EP2010/062998, dated Nov. 23, 2010, 5 pgs.

U.S. Appl. No. 13/441,766, filed Apr. 6, 2012, Inventors: Charles Leyder et al.

International Search Report from Application No. PCT/EP2010/062999, dated Nov. 30, 2010, 4 pgs.

U.S. Appl. No. 13/395,406, filed Mar. 9, 2012, Inventors: Claire Thoumazet et al.

(56) References Cited

OTHER PUBLICATIONS

French Search Report from Application No. 1153114, dated Oct. 31, 2011, 8 pgs.
French Search Report from Application No. 1153113, dated Oct. 31, 2011, 8 pgs.
U.S. Appl. No. 13/441,760, filed Apr. 6, 2012, Inventors: Charles Leyder et al.
C. Ricciardi, et al., "Amorphous Silicon Nitride: a suitable alloy for optical multilayered structures," Journal of Noncrystalline Solids, vol. 3.52, Mar. 31, 2006, pp. 1294-1297, XP002577247.
R. Vernhes et al., "Pulsed Radio Frequency Plasma Deposition of a-SiNx:H Alloys: Film Applications," Journal of Applied Physics, Americal Institute of Physics, New York, US LNKD-DOI:10.1063/1.2349565, vol. 100, No. 6, Sep. 28, 2006, XP012090005.
R. Vernhes et al. "Single-Material Inhomogeneous Optical Filters Based on Microstructural Gradients in Plasma-Deposited Silicon Nitride," Applied Opitcs, vol. 43, No. 1, Jan. 1, 2004, pp. 97-103, XP002577246.
W. Wolke et al., "Sin:H Anti-Reflection Coatings for C-XI Solar Cells by Large Scale Inline Sputtering," Proceedings of the Eupropean Photovoltaic Solar Energy Conference, Jun. 1, 2004, pp. 419-422, XP008078903.

* cited by examiner

LAYERED ELEMENT FOR ENCAPSULATING A SENSTIVE ELEMENT

CROSS-REFERENCE TO RELATED APPLICATION

This application claims priority under 35 U.S.C. §119(a)-(d) to French Application No. 0956207, entitled "Layered Element for Encapsulating a Sensitive Element", by Thoumazet et al., filed Sep. 10, 2009, which is assigned to the current assignee hereof and incorporated herein by reference in its entirety. This application further claims priority under 35 U.S.C. §119(e) to U.S. Patent Application No. 61/254,936 entitled "Layered Element for Encapsulating a Sensitive Element," by Thoumazet et al., filed Oct. 26, 2009, which is assigned to the current assignee hereof and incorporated herein by reference in its entirety.

FIELD OF THE DISCLOSURE

The present invention relates to a layered element for encapsulating an element that is sensitive to air and/or moisture, especially an element that collects or emits radiation such as a photovoltaic cell or an organic light-emitting diode. The invention also relates to a radiation-collecting or radiation-emitting device comprising such a layered element, and also to a process for manufacturing such a layered element.

BACKGROUND

A radiation-collecting device is typically a photovoltaic module comprising at least one photovoltaic cell suitable for collecting and converting the energy from radiation into electrical energy. A radiation-emitting device is typically an OLED device comprising at least one organic light-emitting diode, or OLED, suitable for converting electrical energy into radiation.

In a known manner, the energy conversion elements of a device that collects or emits radiation, namely the photovoltaic cells in the case of a photovoltaic module or the OLED structures in the case of an OLED device, comprise a material suitable for providing the energy conversion and two electrically conductive contacts on both sides of this material. However, regardless of their manufacturing technology, such energy conversion elements are susceptible to degradation under the effect of environmental conditions, in particular under the effect of exposure to air or to moisture. By way of example, for OLED structures or organic photovoltaic cells, the front electrode and the organic material are particularly sensitive to environmental conditions. For thin-film photovoltaic cells comprising an inorganic absorber layer, the front electrode of the cell, formed based on a transparent conductive oxide (or TCO) layer or based on a transparent conductive coating (or TCC), is also very sensitive to environmental conditions.

In order to protect the energy conversion elements of a device that collects or emits radiation with respect to degradations due to exposure to air or to moisture, it is known to manufacture the device with a laminated structure, in which the energy conversion elements are encapsulated and combined with a front substrate and also optionally with a rear substrate, or substrate having a support function.

Depending on the application of the device, the front and rear substrates may especially be composed of a transparent glass or of a transparent thermoplastic polymer, for example made of polyethylene, polyester, polyamide, polyimide, polycarbonate, polyurethane, polymethyl methacrylate or a fluoropolymer. In the case of a photovoltaic cell comprising an absorber layer based on a chalcopyrite compound, in particular comprising copper, indium and selenium, known as a CIS absorber layer, optionally with the addition of gallium (GIGS absorber layer), aluminium or sulphur, a polymer lamination interlayer is positioned between the front electrode and the front substrate, in order to guarantee a good cohesion of the module during its assembly, especially by lamination. It has however been observed that, when a radiation-collecting or radiation-emitting device comprises a polymer lamination interlayer or a polymer substrate positioned against an energy conversion element that is sensitive to air and/or moisture, the device exhibits a high degree of degradation. This is because the presence of the lamination interlayer, which tends to store moisture, or of the polymer substrate, which has a high permeability, promotes the migration of contaminants such as water vapor or oxygen to the sensitive element, and therefore the impairment of the properties of this element.

It is these drawbacks that the invention intends more particularly to remedy by proposing a layered element which, when it is integrated into a device that collects or emits radiation, gives this device improved resistance, especially to air and to moisture, by providing an effective and very long-term protection of the energy conversion elements of the device that are sensitive to air and/or moisture.

SUMMARY

For this purpose, one subject of the invention is a layered element for encapsulating an element that is sensitive to air and/or moisture, especially an element that collects or emits radiation such as a photovoltaic cell or an organic light-emitting diode, the layered element comprising a polymer layer and a barrier layer against at least one face of the polymer layer, characterized in that the or each barrier layer has a moisture vapor transfer rate of less than $10^{-2}$ g/m$^2$ per day and consists of a multilayer of at least two thin hydrogenated silicon nitride layers having alternately lower and higher densities.

Within the meaning of the invention, the expression "thin layer" is understood to mean a layer having a thickness of less than 1 micrometer. In addition, encapsulation of a sensitive element as used herein refers to covering at least part of the sensitive element so that the sensitive element is not exposed to the environmental conditions. Furthermore, within the context of the invention, a "layered element" is an assembly of layers arranged against one another, without prejudging any order of deposition of the constituent layers of the element onto one another.

According to other advantageous features of a layered element according to the invention, taken in isolation or according to all technically possible combinations:

- the or each barrier layer comprises, at the interface between a first layer and a second layer of each pair of successive thin layers of its constituent multilayer, a junction zone having a density gradient between the density of the first layer and the density of the second layer;
- the difference between the density of a higher density layer and the density of a lower density layer of each pair of successive thin layers of the constituent multilayer of the or each barrier layer is greater than or equal to 10% of the density of the lower density layer;
- the layered element comprises a barrier layer against the face of the polymer layer intended to be facing the sensitive element and/or a barrier layer against the face of the polymer layer intended to be facing the other way from the sensitive element;

the polymer layer is a substrate made of a thermoplastic polymer which comprises a barrier layer on at least one of its faces;

the polymer layer is a lamination interlayer that comprises a barrier layer against at least one of its faces;

the polymer layer and the or each barrier layer are transparent, the geometric thickness of each thin layer of the or each barrier layer being adapted in order to maximize the transmission of radiation through the layered element, to or from the sensitive element, via an antireflection effect;

the constituent multilayer of the or each barrier layer comprises at least the superposition of a thin hydrogenated silicon nitride layer having a refractive index between 1.8 and 1.9 at 550 nm and of a thin hydrogenated silicon nitride layer having a refractive index between 1.7 and 1.8 at 550 nm.

Within the meaning of the invention, when the layered element is intended to be integrated at a front face of a device that collects or emits radiation, a layer is considered to be transparent when it is transparent at least in the wavelength ranges of use for, or emitted by, the radiation-collecting or radiation-emitting elements of the device. By way of example, in the case of a photovoltaic module comprising photovoltaic cells based on polycrystalline silicon, each transparent layer is advantageously transparent in the range of wavelengths between 400 nm and 1200 nm, which are the wavelengths of use for this type of cell.

Another subject of the invention is a device comprising an element that is sensitive to air and/or moisture and a layered element as described above serving as a front and/or rear encapsulation element of said sensitive element.

Advantageously, the device is a device that collects or emits radiation, the sensitive element being an element that collects or emits radiation, which is arranged relative to the layered element so as to be capable of collecting radiation that passes through the polymer layer and the or each barrier layer, or of emitting radiation through the polymer layer and the or each barrier layer.

In particular, the element that collects or emits radiation may be a photovoltaic cell or an organic light-emitting diode.

Another subject of the invention is a process for manufacturing a layered element as described above, in which at least some of the thin layers of the constituent multilayer of the or each barrier layer are deposited by plasma-enhanced chemical vapor deposition (PECVD), by sputtering, or combination thereof.

In particular, it is possible to deposit at least some of the thin layers of the constituent multilayer of the or each barrier layer by plasma-enhanced chemical vapor deposition by varying, during the deposition, the pressure in the deposition chamber, the power, the relative proportions of the precursors, or any combination thereof.

It is also possible to deposit at least some of the thin layers of the constituent multilayer of the or each barrier layer by sputtering, especially magnetron sputtering, by varying, during the deposition, the pressure in the deposition chamber, the power, or combination thereof.

BRIEF DESCRIPTION OF THE DRAWINGS

Advantageously, in the case where the thin layers of the constituent multilayer of the or each barrier layer are deposited on one face of a thermoplastic polymer substrate, this face of the substrate is activated, prior to the deposition, by means of a plasma, for example an $O_2$ or $H_2$ plasma.

The features and advantages of the invention will appear in the following description of four exemplary embodiments of a layered element according to the invention, given solely by way of example and made with reference to the appended drawings in which.

DETAILED DESCRIPTION

In the whole of this description, the numerical values of refractive indices are given at 550 nm under illuminant D65, under the DIN 67507 standard.

Figure 1:
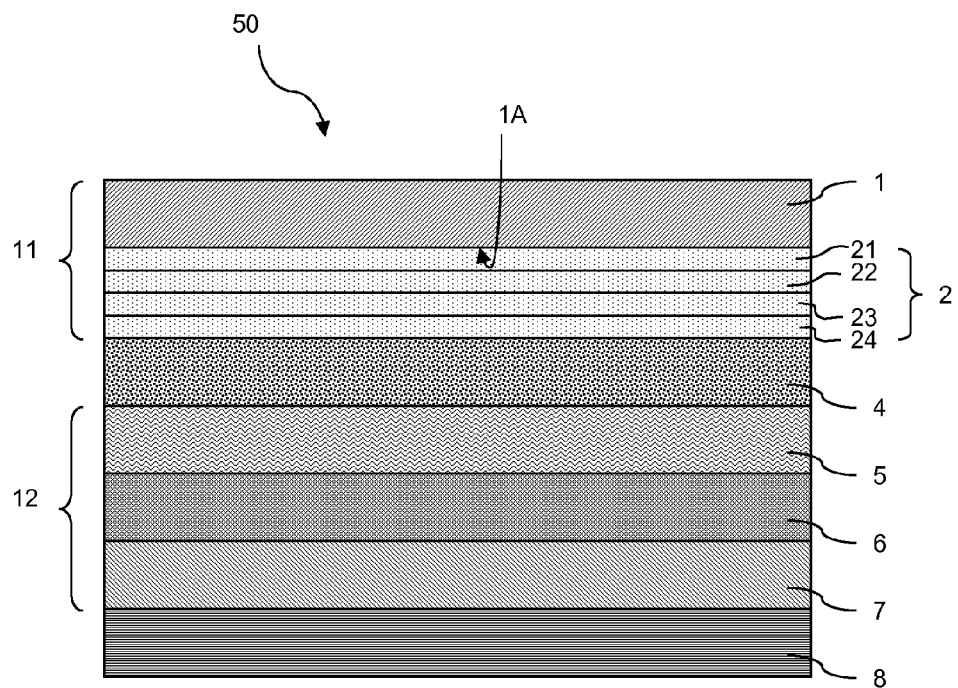
FIG. 1 is a schematic cross section of a photovoltaic solar module comprising a layered element conforming to a first exemplary embodiment of the invention.

The photovoltaic solar module 50 represented in FIG. 1 is a thin-film photovoltaic module, comprising a front substrate 1 and a rear substrate 8 having a support function, between which a multilayer composed of layers 2, 4, 5, 6, 7 is arranged. The front substrate 1, intended to be placed on the side on which solar radiation is incident on the module 50, is composed of a transparent thermoplastic polymer, in particular, in this example, made of polyethylene terephthalate (PET), and has a geometric thickness of 200 micrometers.

The rear substrate 8 is composed of any suitable, transparent or non-transparent, material, and bears, on its face facing the inside of the module 50, that is to say on the side on which solar radiation is incident on the module, an electrically conductive layer 7 that forms a rear electrode of the photovoltaic cell 12 of the module 50. By way of example, the layer 7 is based on molybdenum.

The layer 7 forming the rear electrode is surmounted, in a conventional manner, by a chalcopyrite compound, in particular CIS or CIGS, absorber layer 6, suitable for ensuring the conversion of solar energy to electrical energy. The absorber layer 6 is itself surmounted by a cadmium sulphide (CdS) layer, not represented in the figures, and optionally combined with an undoped intrinsic ZnO layer, also not represented, then by an electrically conductive layer 5 that forms a front electrode of the cell 12. The photovoltaic cell 12 of the module 50 is thus formed by the stack of layers 5, 6 and 7.

A polymer lamination interlayer 4 is positioned between the layer 5 that forms a front electrode and the front substrate 1, so as to ensure that the functional layers of the module 50 are held between the front substrate 1 and the rear substrate 8. The lamination interlayer 4 is a thermosetting polymer layer, namely a layer of ethylene vinyl acetate (EVA) in this example. As a variant, the lamination interlayer 4 may be composed of polyvinyl butyral (PVB), or of any other material having suitable properties.

The layer 5 that forms the front electrode of the cell 12 is a layer based on aluminium-doped zinc oxide (AZO). As a variant and as non-limiting examples, the layer 5 may be a layer based on boron-doped zinc oxide, a layer based on another doped transparent conductive oxide (TCO), or a transparent conductive coating (TCC) such as a silver-based multilayer. In all these cases, the layer 5 that forms the front electrode is a sensitive layer, the properties of which are susceptible to degradation under the effect of exposure to air or to moisture.

With a view to protecting the layer 5 with respect to external environmental conditions, the module 50 comprises a barrier layer 2, which is inserted between the lamination interlayer 4 and the PET front substrate 1. The assembly comprising the superposed substrate 1 and barrier layer 2, where the barrier layer 2 is arranged against the face 1A of the substrate 1 intended to be facing the inside of the module, forms a layered element 11.

In this embodiment, the barrier layer 2 consists of a multilayer stack of four thin transparent layers 21, 22, 23, 24 of hydrogenated silicon nitride having both alternately lower and higher densities and alternately lower and higher refractive indices.

The difference between the density $d_{21}=d_{23}$ of the higher density layers 21 and 23 and the density $d_{22}=d_{24}$ of the lower density layers 22 and 24 is of the order of 10% of the density $d_{22}=d_{24}$ of the lower density layers 22 and 24. Since the layers 21 to 24 are of the same chemical nature $SiN_xH_y$, this difference in density is obtained by varying the stoichiometry, that is to say the values of x and/or y, between the denser layers and the less dense layers.

The presence of the lower density layers 22 and 24 makes it possible to relax the stresses at the denser layers 21 and 23, which limits the formation of defects within the barrier layer 2. Indeed, high densities are often accompanied by high mechanical stresses within the layer, which may be the cause of the appearance of cracks, which are favored paths for the diffusion of contaminants such as water vapor or oxygen.

In particular, a layer varying in density through the thickness is less liable to generate cracks and is consequently more effective in terms of protection against migration of contaminants, such as water vapor and oxygen, than a layer of the same thickness having the same or higher average density, but uniformly dense. The reason for this is that a succession of regions of different density interrupts the propagation of cracks. The diffusion paths, and consequently the diffusion times, are thus considerably lengthened.

Figure 3:
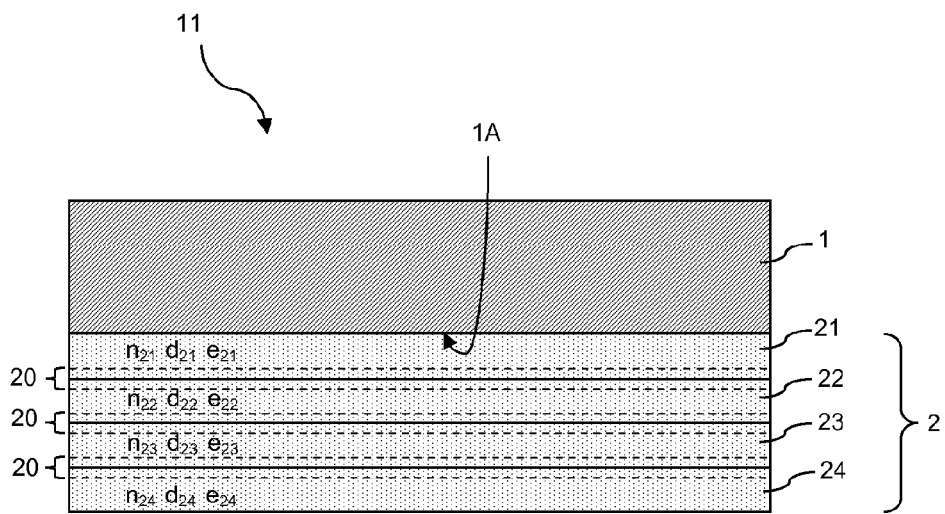
FIG. 3 is a larger-scale view of the layered element from FIGS. 1 and 2.

Moreover, as shown in FIG. 3, for each pair of successive thin layers of the barrier layer 2, the barrier layer comprises, at the interface between the two successive thin layers, a junction zone 20, having a geometric thickness between 10 nm and 30 nm, preferably between 10 nm and 20 nm, which has a density gradient between the density of a first layer and the density of the second layer of the pair of layers. In other words, each junction zone 20 has, from the lower density layer 22 or 24 to the higher density layer 21 or 23, a density gradient between the lower density $d_{22}=d_{24}$ and the higher density $d_{21}=d_{23}$. Due to the junction zones 20, there is a smooth transition, in terms of density, between the various successive thin layers of the constituent multilayer of the barrier layer 2. In particular, it may be considered that the variation of the density in the barrier layer 2 is a continuous periodic variation. This continuous variation of the density in the barrier layer limits the mechanical problems, for example of delamination, which would be capable of occurring in the presence of discontinuities or abrupt changes in density at the interface between the successive layers of the constituent multilayer of the barrier layer.

Advantageously, the barrier layer 2 makes it possible not only to protect the layer 5, but also to guarantee a good transmission of radiation to the photovoltaic cell 12. Specifically, from an optical point of view, the barrier layer 2 may be optimized in order to act as an antireflection coating at the interface between the substrate 1 made of PET and the lamination interlayer 4 made of EVA. A loss of incident radiation on the module 50 occurs at this interface by reflection, due to the difference in refractive indices between the constituent materials of the substrate 1 and of the lamination interlayer 4. However, due to the alternately lower and higher refractive indices $n_{21}$, $n_{22}$, $n_{23}$, $n_{24}$ of the thin layers 21 to 24, and for suitable geometric thicknesses $e_{21}$, $e_{22}$, $e_{23}$, $e_{24}$ of these layers, the barrier layer 2 may constitute an interference filter and provide an antireflection function at the interface between the substrate 1 and the lamination interlayer 4. These suitable values of the geometric thicknesses of the layers of the constituent multilayer of the barrier layer 2 may especially be selected using optimization software.

By way of example, a multilayer of the barrier layer 2 optimized from an optical point of view successively comprises, from the face 1A of the PET substrate 1 to the EVA lamination interlayer 4:

a hydrogenated silicon nitride first layer 21 of relatively higher density $d_{21}$, having a refractive index $n_{21}$ of the order of 1.9 and a geometric thickness $e_{21}$ between 1 and 20 nm, preferably between 5 and 15 nm;

a hydrogenated silicon nitride second layer 22 of relatively lower density $d_{22}$, having a refractive index $n_{22}$ of the order of 1.7 and a geometric thickness $e_{22}$ between 25 and 45 nm, preferably between 30 and 40 nm;

a hydrogenated silicon nitride third layer 23 of relatively higher density $d_{23}=d_{21}$, having a refractive index $n_{23}=n_{21}$ of the order of 1.9 and a geometric thickness $e_{23}$ between 55 and 75 nm, preferably between 60 and 70 nm; and a hydrogenated silicon nitride fourth layer 24 of relatively lower density $d_{24}=d_{22}$, having a refractive index $n_{24}=n_{22}$ of the order of 1.7 and a geometric thickness $e_{24}$ between 65 and 85 nm, preferably between 75 and 85 nm.

This particular four-layer multilayer is the multilayer, optimized from an optical point of view, which has a minimum total geometric thickness, it being understood that other four-layer multilayers, optimized from an optical point of view, are also possible, with different thickness values of the individual thin layers and a total geometric thickness of the multilayer greater than that of the multilayer described above.

An evaluation of the performances of the optimized barrier layer 2 above as a moisture barrier results in a value of the moisture vapor transfer rate (or MVTR) of the layer 2 of less than $10^{-2}$ g/m$^2$ per day. Thus, the four-layer barrier layer 2 provides effective protection of the subjacent layers of the module 50 against moisture, in particular more effective than a single-layer barrier layer composed of hydrogenated silicon nitride $SiN_xH_y$ with a geometric thickness equal to the total geometric thickness of the barrier layer 2 and a constant stoichiometry over the entire thickness of the layer. This is because the succession of the layers 21 to 24 having alternate densities in the thickness of the barrier layer 2 interrupts the propagation of cracks within the layer 2. The diffusion paths and diffusion times of contaminants, such as water vapor and oxygen, are thus considerably extended.

Moreover, the reflection of solar radiation at the interface between the front substrate 1, provided with the barrier layer 2 on its face 1A so as to form the layered element 11, and the lamination interlayer 4 is less than the reflection which would occur at the interface between a PET substrate and the lamination interlayer 4 in the absence of the barrier layer 2. This results in an improved transmission of the solar radiation to the absorber layer 6 through the layered element 11 according to the invention, and therefore an increased photovoltaic efficiency of the module 50 relative to the efficiency obtained in the absence of the barrier layer 2.

Figure 2:
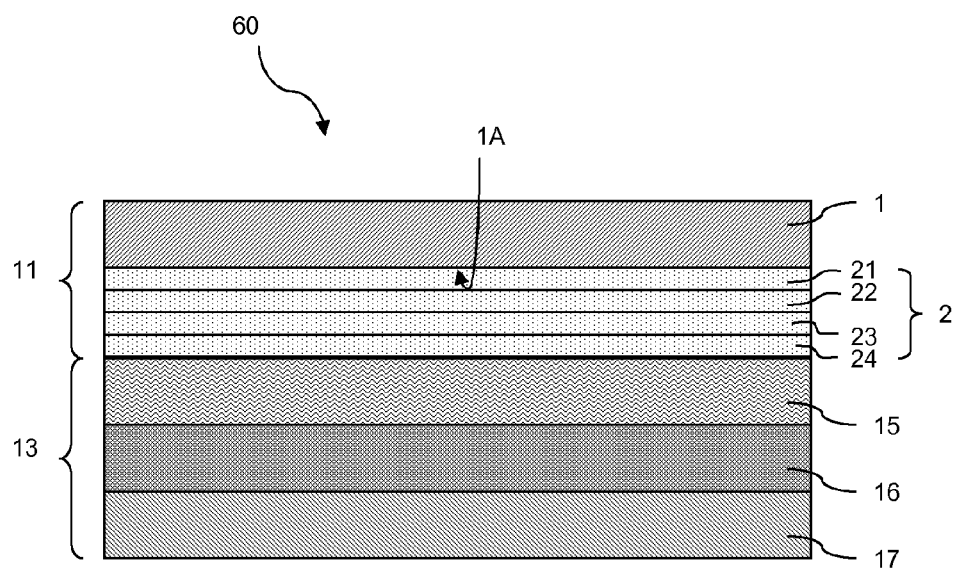
FIG. 2 is a section similar to FIG. 1 for an OLED device comprising the layered element from FIG. 1.

FIG. 2 illustrates the case where the layered element 11 shown in FIGS. 1 and 3 equips an organic light-emitting device or OLED device 60. In a known manner, the OLED device 60 successively comprises the front substrate 1 and the barrier layer 2 that form the layered element 11, a transparent first electrode 15, a multilayer 16 of organic light-emitting layers and a second electrode 17. The substrate 1 is the front substrate of the device 60, arranged on the side on which radiation is extracted from the device, the barrier layer 2 facing the inside of the device.

The first electrode 15 comprises a transparent electroconductive coating, for instance based on tin-doped indium oxide (ITO), or a silver-based multilayer. The multilayer stack of organic layers 16 comprises a central light-emitting layer inserted between an electron transport layer and a hole transport layer, themselves inserted between an electron injection layer and a hole injection layer. The second electrode 17 is made of an electrically conductive material, in particular made of a metallic material of silver or aluminium type. As for the module 50, the barrier layer 2 provides both an effective protection of the subjacent sensitive layers 15, 16 and 17, by preventing the migration of contaminants to these layers, and an optimum radiation transmission from the multilayer stack of light-emitting layers 16 to the outside of the device 60.

Figure 4:
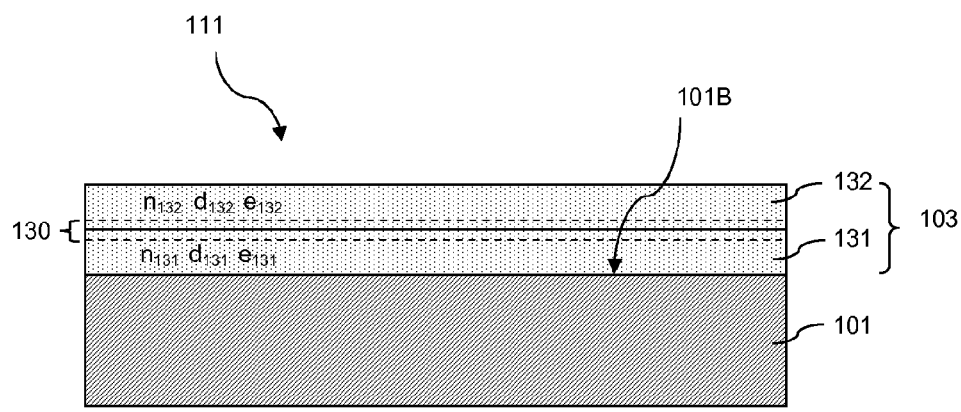
FIG. 4 is a view similar to FIG. 3 for a layered element conforming to a second exemplary embodiment of the invention.

In the second embodiment represented in FIG. 4, the elements analogous to those of the first embodiment bear identical references increased by 100. The layered element 111 conforming to this second embodiment is intended to equip a device that collects or emits radiation, for example a photovoltaic module or an OLED device. The layered element 111 comprises a substrate 101 made of PET, having a geometric thickness of 200 micrometers, and a barrier layer 103 on the face 101B of the substrate intended to be facing the other way from the element that collects or emits radiation. Thus, the layered element 111 is distinguished from the layered element 11 of the first embodiment in that the barrier layer is arranged on the face of the substrate intended to be facing the other way from the element that collects or emits radiation, and not on the face of the substrate intended to be facing the element that collects or emits radiation. Furthermore, the barrier layer 103 is a two-layer, and not four-layer, multilayer, which comprises two thin transparent layers 131, 132 of hydrogenated silicon nitride having both alternately lower and higher densities and alternately lower and higher refractive indices.

In a manner similar to the first embodiment, the difference between the density $d_{131}$ of the higher density layer 131 and the density $d_{132}$ of the lower density layer 132 is of the order of 10% of the density $d_{132}$ of the lower density layer 132, this difference in density being obtained by varying the stoichiometry between the two layers 131 and 132 of the same chemical nature $SiN_xH_y$.

Furthermore, the barrier layer 103 comprises, at the interface between its two constituent thin layers, a junction zone 130 having a geometric thickness between 10 nm and 30 nm, preferably between 10 nm and 20 nm, which has, from the layer 131 to the layer 132, a density gradient between the density $d_{131}$ of the layer 131 and the density $d_{132}$ of the layer 132.

Advantageously, the multilayer of the barrier layer 103 is also designed with suitable geometric thicknesses $e_{131}$, $e_{132}$ and refractive indices $n_{131}$, $n_{132}$ of the layers 131 and 132 so that the barrier layer 103 provides an antireflection function at the interface between the PET substrate 101 and the air. The presence of the barrier layer 103 at this interface is even more effective for maximizing the transmission of radiation through the layered element, to or from the energy conversion elements of the device into which the layered element is integrated, that, due to a large difference in refractive indices between the constituent material of the substrate 101 and the air, the reflection at this interface is high.

By way of example, a two-layer multilayer of the barrier layer 103 that is optimized from an optical point of view, that is to say that makes it possible to obtain a maximum antireflection effect at the interface between the substrate 101 and the air, while having a minimum total geometric thickness, successively comprises, from the face 101B of the substrate 101:

a hydrogenated silicon nitride first layer 131 of relatively higher density $d_{131}$, having a refractive index $n_{131}$ of the order of 1.9 and a geometric thickness $e_{131}$ between 50 and 70 nm, preferably between 60 and 70 nm; and a hydrogenated silicon nitride second layer 132 of relatively lower density $d_{132}$, having a refractive index $n_{132}$ of the order of 1.7 and a geometric thickness $e_{132}$ between 60 and 80 nm, preferably between 70 and 80 nm.

As in the first embodiment, this two-layer barrier layer 103 provides an effective protection of the sensitive subjacent layers of a radiation-collecting or radiation-emitting device against contaminants, with a moisture vapor transfer rate of the layer 103 of less than $10^{-2}$ g/m² per day, in particular more effective than a single-layer barrier layer composed of hydrogenated silicon nitride $SiN_xH_y$ having a constant stoichiometry over the entire thickness of the layer, with a geometric thickness equal to the total geometric thickness of the barrier layer 103. Furthermore, the barrier layer 103 makes it possible to obtain a reduction in the reflection of solar radiation at the interface between the front substrate and the air, relative to the reflection which would occur at the interface between a PET substrate and the air in the absence of the barrier layer. The benefit in terms of the reflection rate is around 3%. Thus, it is possible to improve the energy conversion efficiency of a radiation-collecting or radiation-emitting device by integrating thereinto the layered element 111 conforming to the invention.

Figure 5:
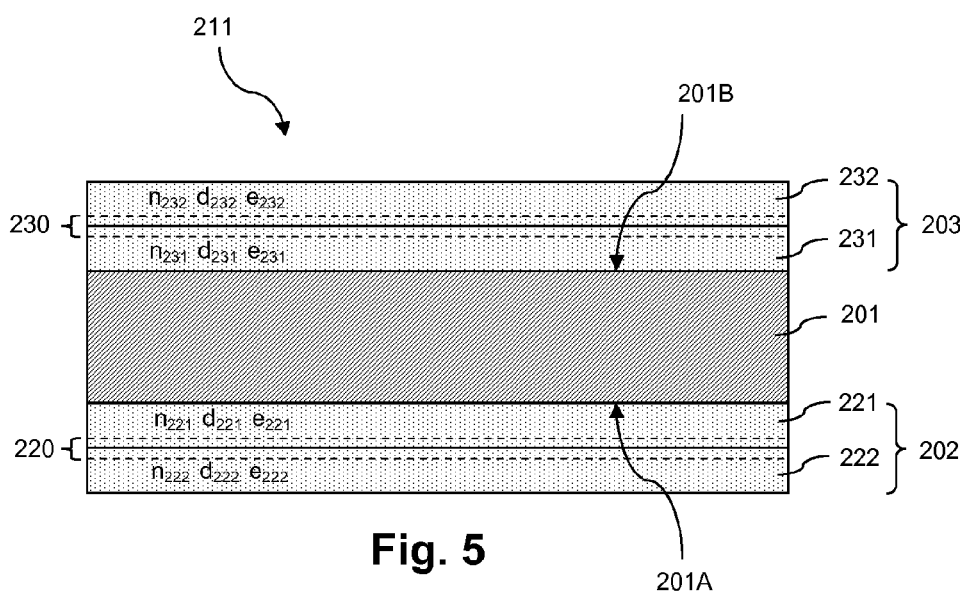
FIG. 5 is a view similar to FIG. 3 for a layered element conforming to a third exemplary embodiment of the invention.

In the third embodiment represented in FIG. 5, the elements analogous to those of the first embodiment bear identical references increased by 200. The layered element 211 conforming to this third embodiment is intended to equip a device that collects or emits radiation, for example a photovoltaic module or an OLED device. The layered element 211 comprises a substrate 201 made of PET, having a geometric thickness of 200 micrometers, and is distinguished from the layered elements 11 and 111 of the preceding embodiments in that it comprises two two-layer barrier layers 202 and 203, deposited respectively on the face 201A of the substrate 201 intended to be facing the element that collects or emits radiation and on the face 201B of the substrate 201 intended to be facing the other way from the element that collects or emits radiation.

Each of the two barrier layers 202 and 203 is a multilayer stack of two thin transparent layers 221, 222 or 231, 232 of hydrogenated silicon nitride having both alternately lower and higher densities and alternately lower and higher refractive indices. As before, the difference between the density of the higher density layers and the density of the lower density layers, which is of the order of 10% of the density of the lower density layers, is obtained, for each barrier layer 202 and 203, by varying the stoichiometry between the two constituent layers of the barrier. Furthermore, each of the two barrier layers 202 and 203 comprises, at the interface between its two constituent thin layers, a junction zone 220 or 230 having a geometric thickness between 10 nm and 30 nm, preferably between 10 nm and 20 nm, which has a density gradient between the density of a first layer and the density of the second layer of the barrier layer.

The examples of two-layer multilayers given below are the multilayers of barrier layers 202 and 203 that make it possible to obtain a maximum antireflection effect at the interface between, respectively, the substrate 201 and an EVA lamination interlayer for the barrier layer 202, and the substrate 201 and the air for the barrier layer 203, while having minimum values of the total geometric thicknesses of the two barrier layers.

For the barrier layer 202 deposited on the face 201A of the substrate 201, the optimized multilayer of minimum geometric thickness successively comprises, from the face 201A of the substrate 201:
- a hydrogenated silicon nitride first layer 221 of relatively higher density $d_{221}$, having a refractive index $n_{221}$ of the order of 1.9 and a geometric thickness $e_{221}$ between 1 and 20 nm, preferably between 5 and 15 nm; and
- a hydrogenated silicon nitride second layer 222 of relatively lower density $d_{222}$, having a refractive index $n_{222}$ of the order of 1.7 and a geometric thickness $e_{222}$ between 100 and 130 nm, preferably between 110 and 125 nm.

For the barrier layer 203 deposited on the face 201B of the substrate 201, the optimized multilayer successively comprises, from the face 201B of the substrate 201:
- a hydrogenated silicon nitride first layer 231 of relatively higher density $d_{231}$, having a refractive index $n_{231}$ of the order of 1.9 and a geometric thickness $e_{231}$ between 60 and 80 nm, preferably between 60 and 70 nm; and
- a hydrogenated silicon nitride second layer 232 of relatively lower density $d_{232}$, having a refractive index $n_{232}$ of the order of 1.7 and a geometric thickness $e_{232}$ between 60 and 90 nm, preferably between 70 and 80 nm.

The layered element 211 having two barrier layers provides an effective protection of sensitive subjacent layers against contaminants and a minimization of the reflection of solar radiation, both at the interface between the layered element and the air and at the interface between the layered element and the subjacent layer of a device into which the layered element is integrated. In particular, each of the layers 202, 203 has a moisture vapor transfer rate of less than $10^{-2}$ g/m² per day.

Figure 6:
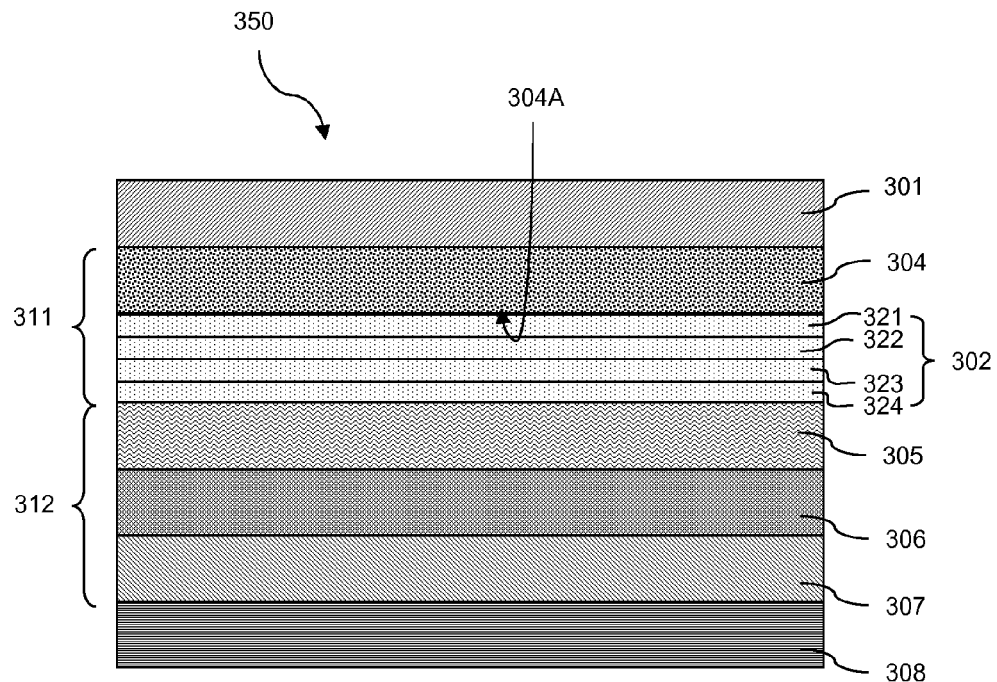
FIG. 6 is a section similar to FIG. 1 for a photovoltaic solar module comprising a layered element conforming to a fourth exemplary embodiment of the invention.
Figure 7:
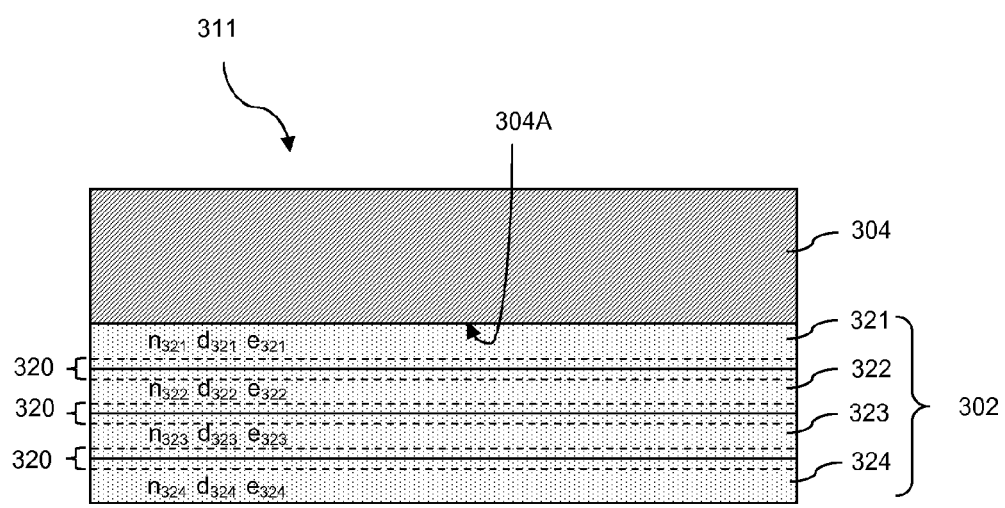
FIG. 7 is a larger-scale view of the layered element from FIG. 6.

In the fourth embodiment represented in FIGS. 6 and 7, the elements analogous to those of the first embodiment bear identical references increased by 300. The photovoltaic solar module 350 represented in FIG. 6 comprises a front substrate 301 composed either of glass or of a transparent thermoplastic polymer. The module 350 also comprises a rear substrate 308 which bears, on its face facing the inside of the module 350, an electrically conductive layer 307 that forms a rear electrode of the photovoltaic cell 312 of the module. The layer 307 is surmounted by a layer 306 of chalcopyrite compound, in particular CIS or CIGS, absorber material suitable for ensuring the conversion of solar energy to electrical energy. In a similar manner to the first embodiment, the absorber layer 306 is itself surmounted by a moisture-sensitive, electrically conductive layer 305, based on aluminium-doped zinc oxide (AZO), which forms a front electrode of the cell 312. The photovoltaic cell 312 of the module 350 is thus formed by the multilayer stack of layers 305, 306 and 307.

A polymer lamination interlayer 304 made of EVA, provided in order to ensure that the functional layers of the module 350 are held between the front substrate 301 and the rear substrate 308, is positioned above the AZO layer 305, against the front substrate 301. As a variant, the lamination interlayer 304 may be composed of PVB, or of any other material having suitable properties. In order to protect the AZO layer 305, which is a moisture-sensitive layer, with respect to the moisture possibly stored in the lamination interlayer 304, the module 350 comprises a barrier layer 302 inserted between the layers 304 and 305. The superposed lamination interlayer layer 304 and barrier layer 302 form a layered element 311, where the barrier layer 302 is positioned against the face 304A of the layer 304 intended to be facing the inside of the module. As in the first embodiment, the barrier layer 302 consists of a multilayer composed of four thin transparent layers 321, 322, 323, 324 of hydrogenated silicon nitride having both alternately lower and higher densities and alternately lower and higher refractive indices, where the geometric thickness of each thin layer of the multilayer 302 is optimized from an optical point of view in order to obtain an antireflection effect at the interface between the EVA lamination interlayer layer 304 and the AZO layer 305 forming the front electrode.

The reduction in the reflection capable of being obtained in this fourth embodiment owing to the barrier layer 302 is particularly high, due to the large difference in refractive index between the lamination interlayer and the AZO. As before, the difference between the density of the higher density layers and the density of the lower density layers of the barrier layer 302 is of the order of 10% of the density of the lower density layers. Moreover, for each pair of successive thin layers of the barrier layer 302, the barrier layer comprises, at the interface between the two successive layers, a junction zone 320, having a geometric thickness between 10 nm and 30 nm, preferably between 10 nm and 20 nm, which has a density gradient between the density of a first layer and the density of the second layer of the pair of layers.

By way of example, a four-layer multilayer of the barrier layer 302 that is optimized from an optical point of view, that is to say that makes it possible to obtain a maximum antireflection effect at the interface between the EVA layer 304 and the AZO layer 305, while having a minimum total geometric thickness, successively comprises, from the face 304A of the lamination interlayer layer 304 to the AZO layer 305:
- a hydrogenated silicon nitride first layer 321 of relatively lower density $d_{321}$, having a refractive index $n_{131}$ of the order of 1.7 and a geometric thickness $e_{321}$ between 25 and 60 nm, preferably between 35 and 50 nm;
- a hydrogenated silicon nitride second layer 322 of relatively higher density $d_{322}$, having a refractive index $n_{322}$ of the order of 1.9 and a geometric thickness $e_{322}$ between 100 and 150 nm, preferably between 115 and 140 nm;
- a hydrogenated silicon nitride third layer 323 of relatively lower density $d_{323}=d_{321}$, having a refractive index $n_{323}=n_{321}$ of the order of 1.7 and a geometric thickness $e_{323}$ between 1 and 30 nm, preferably between 10 and 20 nm; and
- a hydrogenated silicon nitride fourth layer 324 of relatively higher density $d_{324}=d_{322}$, having a refractive index $n_{324}=n_{322}$ of the order of 1.9 and a geometric thickness $e_{324}$ between 1 and 30 nm, preferably between 10 and 20 nm.

The barrier layer 302 has a moisture vapor transfer rate of less than $10^{-2}$ g/m$^2$ per day and makes it possible to obtain a reduction in the reflection of solar radiation at the interface between the EVA layer 304 and the AZO layer 305 corresponding to a benefit, in terms of reflection rate, of around 2%.

The preceding examples illustrate the advantages of a layered element according to the invention which, when it is integrated into a device that collects or emits radiation, gives this device an improved resistance with respect to degradations induced by exposure to air or to moisture, without a reduction in the energy conversion efficiency of the device, or even with an increase in this efficiency via an antireflection effect of the barrier layer of the layered element.

The antireflection effect, obtained by adapting the geometric thicknesses of the various constituent thin hydrogenated silicon nitride layers of the barrier layer, is advantageous but not obligatory. The main function of a layered element according to the invention is to provide an effective and long-term protection of the sensitive elements of the device into which it is integrated, namely, in particular, the energy conversion elements in the case of a device that collects or emits radiation. In particular, a layered element according to the invention may be used for the front encapsulation and/or for the rear encapsulation of an element that is susceptible to degradation under the effect of environmental conditions. In the case where the sensitive element is not an element that collects or emits radiation, an antireflection function of the layered element is pointless, likewise in the case where the layered element is used for the rear encapsulation of an element that collects or emits radiation, especially a photovoltaic cell or an organic light-emitting diode.

The invention is not limited to the examples described and represented. Generally, the aforementioned advantages in terms of protection with respect to environmental conditions may be obtained by means of any layered element comprising a polymer layer, in particular a layer formed from a thermoplastic polymer substrate or from a polymer lamination interlayer, and at least one barrier layer consisting of a multilayer of at least two thin hydrogenated silicon nitride layers having alternately lower and higher densities.

In particular, in the examples described above, the or each barrier layer is a thin transparent layer. As a variant, at least one barrier layer of a layered element conforming to the invention can be a non transparent layer, in particular when the layered element is used for the rear encapsulation of an element that collects or emits radiation, or for the front and/or rear encapsulation of an element that is susceptible to degradation under the effect of environmental conditions but that is not an element that collects or emits radiation. The characteristics of the thin hydrogenated silicon nitride layers of the or each barrier layer of a layered element according to the invention can be different from those described previously, especially their refractive indices and their thicknesses. The or each barrier layer of a layered element conforming to the invention may also comprise any number, greater than or equal to two, of thin superposed layers.

Moreover, in the case where the polymer layer of the layered element according to the invention is a thermoplastic polymer substrate, it may be composed of any thermoplastic polymer having suitable properties, this thermoplastic polymer possibly or possibly not being transparent depending on the application. Examples of suitable thermoplastic polymers include, in particular, polyethylene terephthalate (PET), polyethylene naphthalate (PEN), polycarbonate, polyurethane, polymethyl methacrylate, polyamides, polyimides, or fluoropolymers such as ethylene tetrafluoroethylene (ETFE), polyvinylidene fluoride (PVDF), polychlorotrifluoroethylene (PCTFE), ethylene chlorotrifluoroethylene (ECTFE), fluorinated ethylene propylene copolymers (FEP). In the same way, in the case where the polymer layer is a polymer lamination interlayer, it may be composed of any polymer having suitable properties, for example thermosetting polymers, such as EVA or PVB, or else ionomers, thermoplastic urethanes, polyolefin melt adhesives, thermoplastic silicones. The polymer layer of a layered element according to the invention may also be of any dimensions suitable for its role, in particular having a geometric thickness different from those described previously by way of examples.

A layered element according to the invention may also be used in any type of device comprising an element that is sensitive to air and/or moisture, without being limited to the radiation-collecting or radiation-emitting devices described previously. In particular, the invention may be applied for the encapsulation of thin-film photovoltaic cells whose absorber layer is a thin layer based on amorphous or microcrystalline silicon, or based on cadmium telluride, instead of a thin layer of a chalcopyrite compound of CIS or CIGS type. In a known manner, in the case where the absorber layer is a thin CIS or CIGS absorber layer, the photovoltaic module is manufactured in substrate mode, that is to say by successive deposition of the constituent layers of the cell onto the rear substrate of the module. In particular, in the case of the fourth embodiment, the barrier layer 302 is deposited on the layer 305 forming the front electrode. On the contrary, in the case where the absorber layer is a thin silicon-based layer or a thin layer based on cadmium telluride, the photovoltaic module is manufactured in superstrate mode, that is to say by successive deposition of the constituent layers of the cell starting from the front substrate of the module.

The invention may also be applied to the modules with organic photovoltaic cells, for which the organic absorber layer is particularly sensitive to environmental conditions, or else to the modules whose photovoltaic cells are made from polycrystalline or monocrystalline silicon wafers forming a p-n junction. A layered element according to the invention may also be applied to the modules with die-sensitized solar cells (DSSC), or Gratzel cells, for which an exposure to moisture may lead to a degradation of the electrodes and to a dysfunction of the electrolyte by producing interfering electrochemical reactions.

One preferred process for manufacturing a layered element conforming to the invention, comprising a polymer layer and a hydrogenated silicon nitride multilayer barrier layer against at least one face of the polymer layer, comprises the deposition of the or each barrier layer by plasma-enhanced chemical vapor deposition (PECVD).

This reduced-pressure deposition technique uses the decomposition of precursors under the effect of a plasma, in particular under the effect of collisions between the excited or ionized species of the plasma and the molecules of the precursor. The plasma may, for example, be obtained by a radiofrequency discharge created between two planar electrodes (RF-PECVD), or using electromagnetic waves in the microwave range (MW-PECVD). The microwave PECVD technique using coaxial tubes to generate the plasma has the advantage of allowing the deposition onto a large-sized moving film, with particularly high deposition rates.

The PECVD technique is particularly advantageous for the manufacture of a layered element conforming to the invention since it makes it possible to very easily obtain a variation in the density and in the stoichiometry of a layer, via modification of quantities such as the pressure in the deposition chamber, the power, the relative proportions of the precursors, or combination thereof. In particular, increasing the pressure in the deposition chamber generally favors the formation of less dense layers. It is thus possible to vary the pressure during the deposition in order to correlatively obtain a variation in the density and in the stoichiometry. An increase in the power may lead to an increase in the density of the layer. Furthermore, a modification of the relative proportions of the precursors may result in a change in the stoichiometry of the constituent material of the layer, impacting the refractive index and/or the density of the layer.

According to a variant, it is possible to deposit the or each multilayer barrier layer on the polymer substrate via sputtering, especially magnetron sputtering, by varying one or both of the following quantities during the deposition: the pressure in the deposition chamber, the power. An increase in the pressure, as in the case of PECVD, favors the formation of less dense layers.

Other deposition techniques are possible, especially evaporation techniques, or atmospheric pressure PECVD processes, in particular those using dielectric barrier discharge technologies.

By way of illustration, in the case of the layered element 11 conforming to the first embodiment, which comprises the PET substrate 1 and the hydrogenated silicon nitride four-layer barrier layer 2, the process for manufacturing the layered element by PECVD comprises steps as described below.

The PET substrate 1 is introduced into a chamber for deposition by RF-PECVD under reduced pressure. The face 1A of the substrate 1 is then activated by means of a plasma, especially an $O_2$ or $H_2$ plasma, in order to clean the face 1A of the substrate and to improve the adhesion of the barrier layer 2 to this face.

The precursors for the deposition of the barrier layer 2 of $SiN_xH_y$ type are an $SiH_4/NH_3$ mixture diluted in an $N_2/H_2$ mixture. This dilution allows a better stabilization of the plasma, while contributing to the physicochemical properties of the barrier layer obtained.

The deposition is carried out in four successive steps. In a first step, the pressure in the chamber is set at 400 mTorr, the surface power density deposited by the plasma being 0.15 W/cm$^2$. In a second step, the pressure is gradually increased to 600 mTorr, the power being 0.10 W/cm$^2$. The third and fourth steps are identical, respectively, to the first and second steps.

In order to obtain the junction zones 20 having a density gradient, the plasma is not interrupted and the parameters of pressure and of power are modified continuously between the steps of depositing the two successive thin layers of each pair of successive thin layers of the multilayer of the barrier layer 2. In other words, a continuously increasing pressure ramp and a continuously decreasing power ramp are applied, the duration of these ramps being adapted in order to obtain the desired geometric thickness of each junction zone 20.

The deposition of the barrier layer 2 on the substrate 1 is carried out at a temperature close to ambient temperature, below 100° C.

The hydrogenated silicon nitride barrier layer 2 of suitable thickness is thus obtained, it being possible to subdivide this barrier layer into four successive sublayers 21 to 24 that each correspond to one step of the deposition. The refractive index and the density are higher in the first and third layers 21 and 23 than in the second and fourth layers 22 and 24.

The manufacture of the layered elements 111, 211 conforming to the second and third embodiments is carried out according to processes similar to that described above for the layered element 11, by deposition of the barrier layers 103, 202, 203 on the corresponding faces of the substrate 101 or 201. In the case of the layered element 311 of the fourth embodiment, the barrier layer 302 is deposited on the AZO layer 305 according to a process similar to that described above for the layered element 11, the lamination interlayer 304 then being deposited on the barrier layer 302.

The invention claimed is:

1. A device comprising an element that is sensitive to air and/or moisture, characterized in that it comprises:
   a layered element as a front and/or rear encapsulation element of said sensitive element, wherein the layered element comprises
   a polymer layer; and
   a barrier layer against at least one face of the polymer layer, characterized in that the barrier layer has a moisture vapor transfer rate of less than $10^{-2}$ g/m$^2$ per day and consists of a multilayer of at least two thin hydrogenated silicon nitride layers having alternately lower and higher densities to provide a constituent multilayer of a lower density hydrogenated silicon nitride layer and a higher density hydrogenated silicon nitride layer, wherein the two thin layers comprise a junction zone at an interface between the two thin layers, the junction zone having a density gradient between the density of the lower density hydrogenated silicon nitride layer and the higher density hydrogenated silicon nitride layer.

2. The device according to claim 1 that collects or emits radiation, characterized in that the sensitive element is an element that collects or emits radiation, which is arranged relative to the layered element so as to be capable of collecting radiation that passes through the polymer layer and the barrier layer, or of emitting radiation through the polymer layer and the barrier layer.

3. The device according to claim 2, characterized in that the element that collects or emits radiation is a photovoltaic cell or an organic light-emitting diode.

4. A layered element for encapsulating an element that is sensitive to air and/or moisture that collects or emits radiation comprising a photovoltaic cell or an organic light-emitting diode, the layered element comprising:
   a polymer layer; and
   a barrier layer against at least one face of the polymer layer, characterized in that the barrier layer has a moisture vapor transfer rate of less than $10^{-2}$ g/m$^2$ per day and consists of a multilayer of at least two thin hydrogenated silicon nitride layers, having alternately lower and higher densities to provide a constituent multilayer of a lower density hydrogenated silicon nitride layer and a higher density hydrogenated silicon nitride layer, wherein the two thin layers comprise a junction zone at an interface between the two thin layers, the junction zone having a density gradient between the density of the lower density hydrogenated silicon nitride layer and the higher density hydrogenated silicon nitride layer.

5. The layered element according to claim 4, characterized in that the difference between the density of the higher density hydrogenated silicon nitride layer and the density of the lower density hydrogenated silicon nitride layer of each pair of successive thin layers of the constituent multilayer of the barrier layer is greater than or equal to 10% of the density of the lower density hydrogenated silicon nitride layer.

6. The layered element according to claim 4, characterized in that the barrier layer is positioned against the face of the polymer layer intended to be facing the sensitive element and/or the barrier layer is positioned against the face of the polymer layer intended to be facing the other way from the sensitive element.

7. The layered element according to claim 4, characterized in that the polymer layer is a substrate made of a thermoplastic polymer.

8. The layered element according to claim 4, characterized in that the polymer layer is a lamination interlayer.

9. The layered element according to claim 4, characterized in that the polymer layer and the barrier layer are transparent, a geometric thickness of each thin layer of the barrier layer being adapted in order to maximize the transmission of radiation through the layered element, to or from the sensitive element, via an antireflection effect.

10. The layered element according to claim 9, characterized in that the higher density hydrogenated silicon nitride layer has a refractive index between 1.8 and 1.9 at 550 nm and the lower density hydrogenated silicon nitride layer has a refractive index between 1.7 and 1.8 at 550 nm.

11. A process for manufacturing the layered element according to claim 1, the process comprising the step of depositing the at least two thin hydrogenated silicon nitride layers by plasma enhanced chemical vapor deposition (PECVD) or sputtering.

12. The manufacturing process according to claim 11, wherein the at least two thin hydrogenated silicon nitride layers are deposited by plasma enhanced chemical vapor deposition (PECVD).

13. The manufacturing process according to claim 11, wherein the at least two thin hydrogenated silicon nitride layers are deposited by sputtering.

14. The manufacturing process according to claim 11, wherein the polymer layer is a thermoplastic polymer substrate, the face of said thermoplastic polymer substrate is activated by means of a plasma.

* * * * *